United States Patent
Park

(10) Patent No.: US 7,572,026 B2
(45) Date of Patent: Aug. 11, 2009

(54) LIGHT-EMITTING MODULE AND BACKLIGHT UNIT HAVING THE SAME

(75) Inventor: Jun Seok Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 190 days.

(21) Appl. No.: 11/584,601

(22) Filed: Oct. 23, 2006

(65) Prior Publication Data

US 2007/0102720 A1 May 10, 2007

(30) Foreign Application Priority Data

Oct. 25, 2005 (KR) ................ 10-2005-0100584

(51) Int. Cl.
*G09F 13/04* (2006.01)

(52) U.S. Cl. ............... 362/97.3; 362/231; 362/241; 362/294; 362/631; 362/97.2

(58) Field of Classification Search .......... 362/225, 362/245, 368, 612, 613, 97.1, 97.2, 97.3 362/294, 631, 231; 257/98, 99
See application file for complete search history.

(56) References Cited

U.S. PATENT DOCUMENTS 5,008,658 A * 4/1991 Russay et al. ............. 345/87

| | | | | |
|---|---|---|---|---|
| 5,469,347 A | * | 11/1995 | Duve et al. | 362/245 |
| 7,152,988 B2 | * | 12/2006 | Hung | 362/97 |
| 7,229,194 B2 | * | 6/2007 | Liu et al. | 362/225 |
| 2005/0045897 A1 | * | 3/2005 | Chou et al. | 257/98 |
| 2007/0047238 A1 | * | 3/2007 | Vukosic et al. | 362/368 |

FOREIGN PATENT DOCUMENTS

JP       2003-279977      10/2003
KR    10-2004-0099311 B1   11/2004

* cited by examiner

*Primary Examiner*—Stephen F Husar
*Assistant Examiner*—James W Cranson
(74) *Attorney, Agent, or Firm*—Birch, Stewart, Kolasch & Birch, LLP

(57) ABSTRACT

A light-emitting module is provided. The light-emitting module comprises a printed circuit board, a plurality of light-emitting devices, and at least one module lens. The plurality of light-emitting devices are formed on the printed circuit board. At least one module lens is supported by the printed circuit board and reflects light emitted from the plurality of light-emitting devices.

14 Claims, 4 Drawing Sheets

LIGHT-EMITTING MODULE AND BACKLIGHT UNIT HAVING THE SAME

BACKGROUND OF THE INVENTION

1. Field of the Invention

The present invention relates to a light-emitting module and a backlight unit having the same.

2. Description of the Related Art

A light-emitting device used for a light-emitting module is formed of a compound semiconductor. The light-emitting module is widely used for remote controllers of home appliances, and display apparatuses such as display boards. Also, the light-emitting module is also used for a backlight unit of a liquid crystal display (LCD) device.

The LCD device may be also applied to large-sized image apparatuses such as televisions and monitors, and applied to portable apparatuses such as mobile communication terminals.

Particularly, to meet miniaturization and slim profile trends of information telecommunication apparatuses, resistors, condensers, and noise filters, which are parts of the apparatuses, are miniaturized even more, and also the light-emitting device is manufactured in a surface mount device (SMD) type in order to be directly mounted on a printed circuit board (PCB). The light-emitting module to which the SMD type light-emitting device is applied is manufactured in a top-view type or a side-view type depending on a use purpose thereof.

The related art light-emitting module includes a light-emitting device attached on a board having basic circuits formed on the board (i.e., a PCB), and a mold member formed on the board to protect the light-emitting device. Also, a separately processed lens is individually formed on the light-emitting device to control a direction of light emitted from the light-emitting device.

Accordingly, a related art light-emitting module has inconvenience that a separately processed lens should be individually formed on each light-emitting device.

Also, as a driving circuit unit for driving the light-emitting device is formed separately from a PCB where the light-emitting device is formed, there is inconvenience that the driving circuit unit should be connected using wiring boding, and a structure is complicated.

SUMMARY OF THE INVENTION

Accordingly, the present invention provides a light-emitting module and a backlight unit having the same that substantially obviates one or more problems due to limitations and disadvantages of the related art.

The present invention provides a light-emitting module and a backlight unit having the same, capable of realizing a slim profile and a simple coupling structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The embodiment of the invention provides a light-emitting module comprising: a printed circuit board; a plurality of light-emitting devices formed on the printed circuit board; and at least one module lens supported by the printed circuit board and reflecting light emitted from the plurality of light-emitting devices.

Also, the embodiment of the present invention provides a light-emitting module comprising: a printed circuit board; a plurality of light-emitting devices formed on the printed circuit board; and two or more module lenses supported by the printed circuit board and constituting a pair formed to face each other to reflect light emitted from the plurality of light-emitting devices.

The embodiment of the present invention provides a backlight unit comprising: a light-emitting module including a printed circuit board, a plurality of light-emitting devices formed on the printed circuit board, and a module lens for reflecting light emitted from the plurality of light-emitting devices; and a lower case for supporting the light-emitting module.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. In the description of the present invention, it will be understood that when an element is referred to as being "on" another element, it can be directly or indirectly on the other layer.

Figure 1:
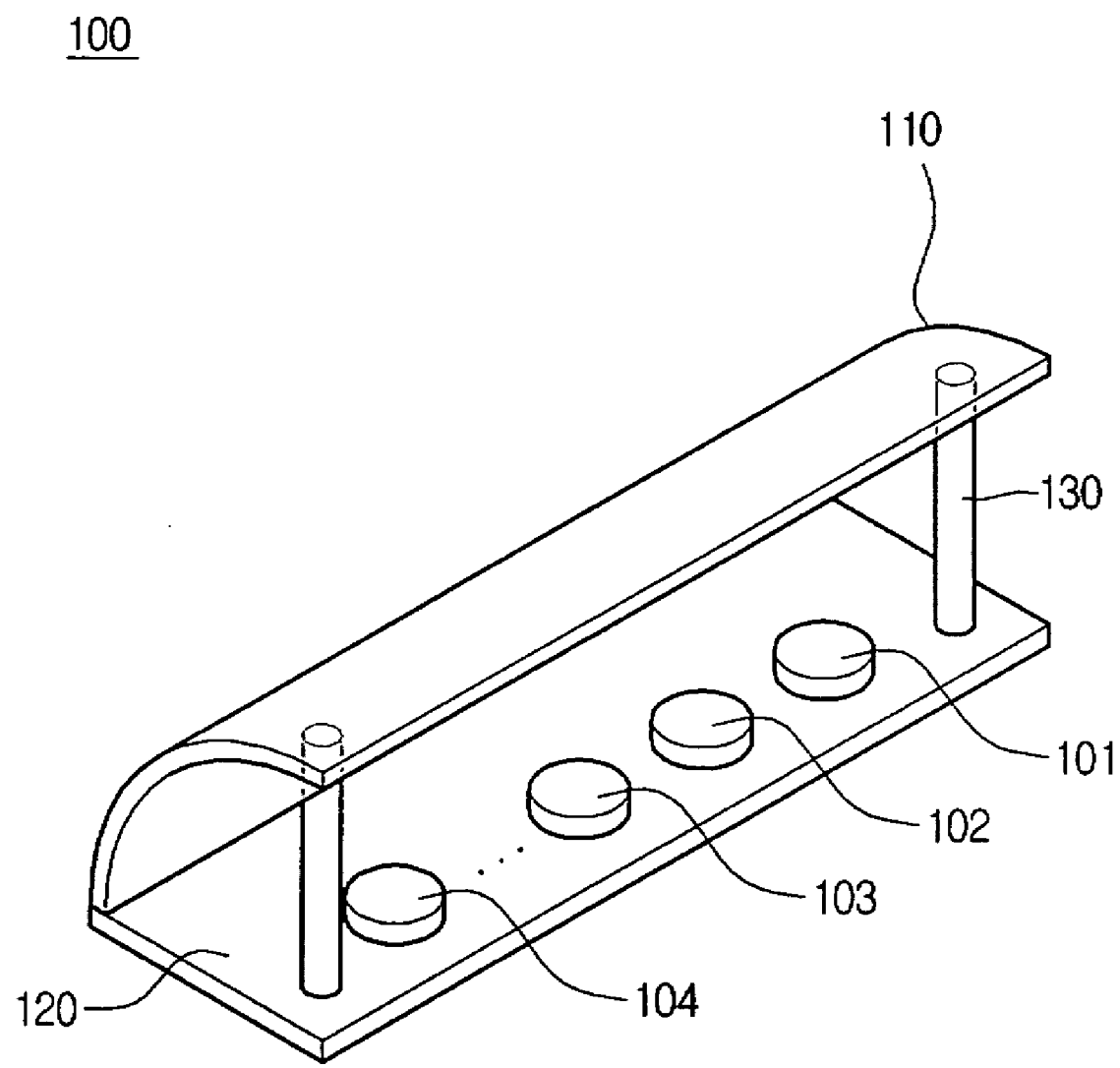
FIG. 1 is a view conceptually illustrating a light-emitting module according to the present invention.

FIG. 1 is a view conceptually illustrating a light-emitting module according to the present invention.

Referring to FIG. 1, the light-emitting module 100 includes a plurality of light-emitting devices 101, 102, 103, and 104, and a module lens 110. The module lens 110 and the plurality of light-emitting devices 101, 102, 103, and 104 are formed on a printed circuit board (PCB) 120. The PCB 120 may be a metal core PCB (MCPCB).

The module lens 110 has one side supported by the PCB 120 and the other side supported by a support member 130 formed on the PCB 120.

According to the present invention, the module lens 110 of an integral type is formed over the plurality of light-emitting devices 101, 102, 103, and 104. The module lens 110 transmits or reflects light emitted from the plurality of light-emitting devices 101, 102, 103, and 104. At this point, a plurality of module lenses 110 are provided, and the light-emitting devices 101, 102, 103, and 104 are arranged to correspond to the module lenses 100.

When light emitted from the light-emitting devices 101, 102, 103, and 104 is incident, the module lens 110 reflects the incident light to change a progression direction of the light.

At this point, the module lens 110 can be formed in a bar shape having a predetermined curvature, and a surface of the module lens 110 that faces the light-emitting devices 101, 102, 103, and 104 can be a concave surface. The module lens 110 is spaced a predetermined distance from the light-emitting devices 101, 102, 103, and 104.

The light emitted from the light-emitting devices 101, 102, 103, and 104 is reflected by the module lens 110 and can be incident to the PCB 120. Light of R, G, and B emitted from the plurality of light-emitting devices 101, 102, 103, and 104 can be appropriately mixed.

In a related art light-emitting module, a lens is separately provided to each light-emitting device. On the contrary, according to the light-emitting module 100 of the present invention, the module lens 110 is formed in an integral type, so that the forming of the module lens 110 can be easily realized.

The plurality of light-emitting devices 101, 102, 103, and 104 are formed on the PCB 120 in the form of a chip-on-board (COB), and a molding member for protecting the light-emitting devices 101, 102, 103, and 104 is formed in a dome shape, so that a light-emitting efficiency improves.

The plurality of light-emitting devices 101, 102, 103, and 104 can include a red light-emitting diode (LED), a green LED, and a blue LED. Also, the plurality of light-emitting devices can additionally include LEDs in a variety of wavelength bands such as a yellow LED and an amber-colored LED. Here, the plurality of light-emitting devices 101, 102, 103, and 104 can be formed to emit light corresponding to a wavelength band of 380- 760 nm.

Figure 2:
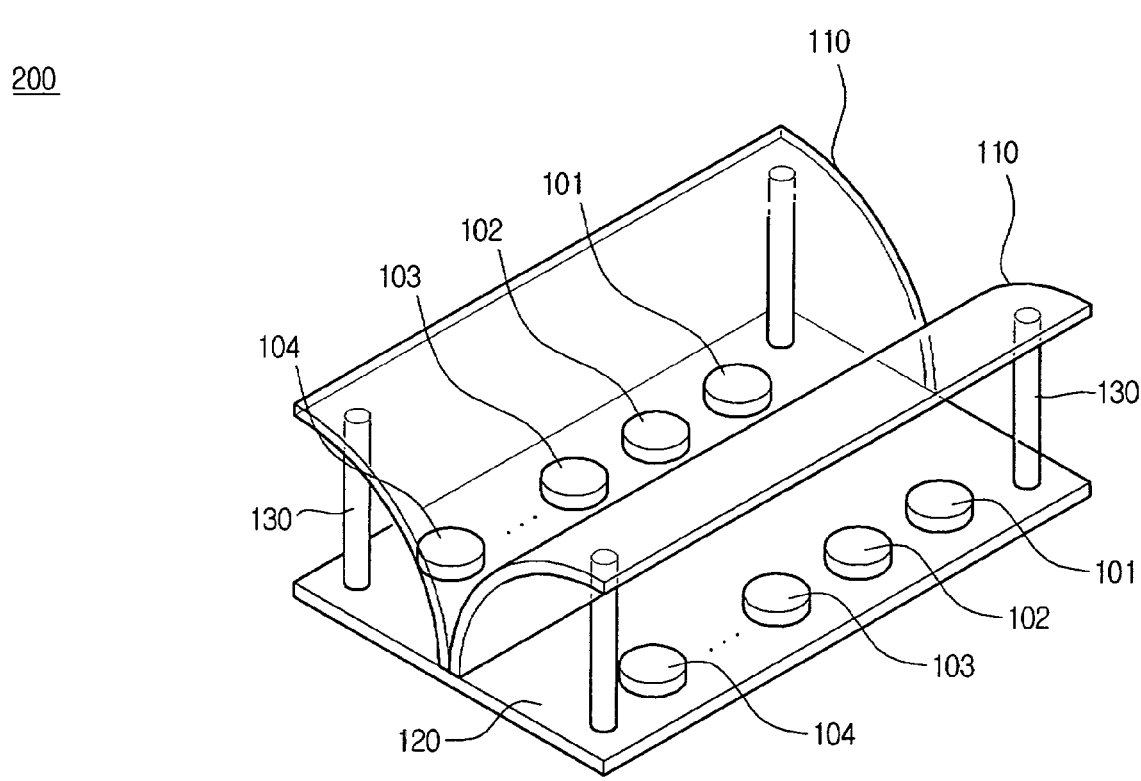
FIG. 2 is a schematic view of a light-emitting module according to an embodiment of the present invention.

FIG. 2 is a schematic view of a light-emitting module according to an embodiment of the present invention.

Referring to FIG. 2, the light-emitting module can be realized to emit light in both directions.

The light-emitting module 200 includes a plurality of light-emitting devices 101, 102, 103, and 104, and a plurality of module lenses formed on a PCB 120.

The plurality of module lenses 110 can be disposed such that convex surfaces thereof face each other. Light emitted from the plurality of light-emitting devices 101, 102, 103, and 104 can be emitted to both directions.

Figure 3:
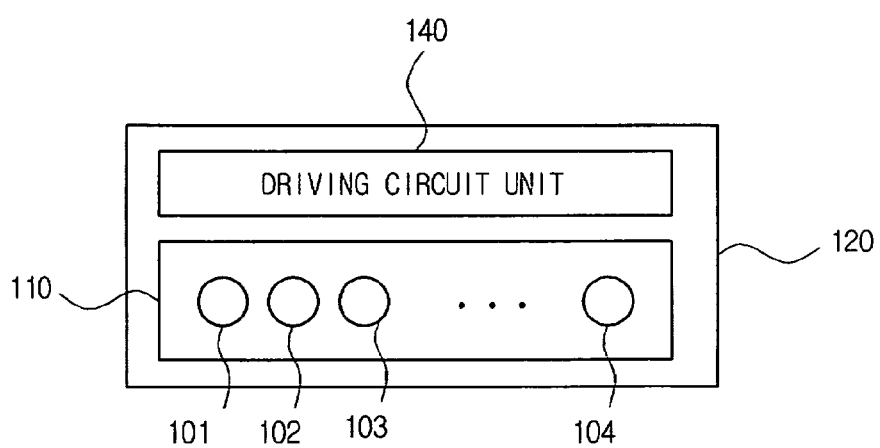
FIG. 3 is a schematic view of a light-emitting module according to another embodiment of the present invention.
Figure 4:
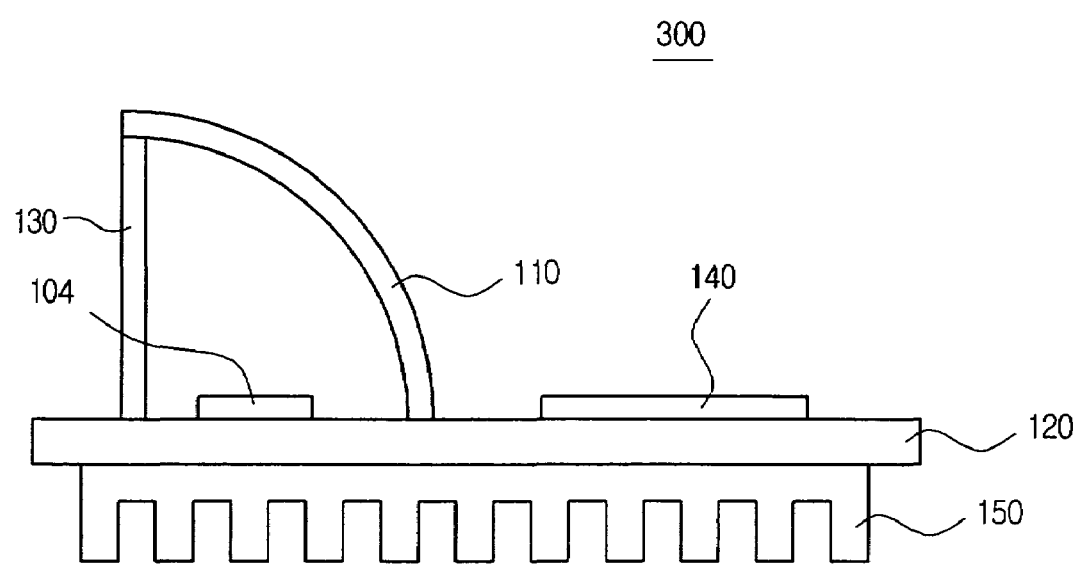
FIG. 4 is a schematic side view of the light-emitting module of FIG. 3.

FIG. 3 is a schematic view of a light-emitting module according to another embodiment of the present invention, and FIG. 4 is a schematic side view of the light-emitting module of FIG. 3.

Referring to FIGS. 3 and 4, the light-emitting module 300 according to an embodiment of the present invention includes a plurality of light-emitting devices 101, 102, 103, and 104, a module lens 110, a PCB 120, a driving circuit unit 140, and a heatsink plate 150.

In the light-emitting module 300, the plurality of light-emitting devices 101, 102, 103, and 104, the module lens 110, and the driving circuit unit 140 are integrally formed on the PCB 120.

Since the elements constituting the light-emitting module 300 are integrally formed on the PCB 120, a coupling structure of the elements can be simplified even more, and a thickness of the light-emitting module can be slim. Also, a heat discharge problem can be solved by forming the heatsink plate 150 on a lower portion of the PCB 120.

The light-emitting module having the above-described construction can be applied to a variety of fields. An example where the light-emitting module is applied to a backlight unit is illustrated in FIG. 5.

Figure 5:
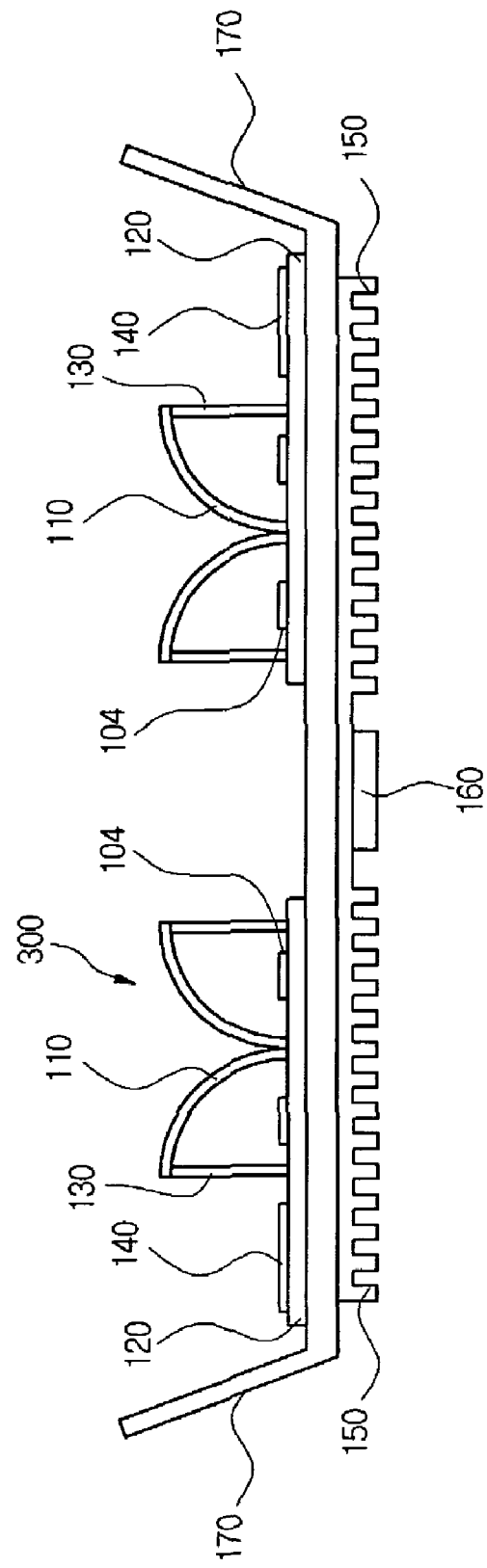
FIG. 5 is a schematic view of a backlight unit according to the present invention.

FIG. 5 is a schematic view of a backlight unit according to the present invention.

Referring to FIG. 5, the backlight unit includes a light-emitting module 300, a lower case 170, heatsink plates 150, and a control unit 160.

The light-emitting module 300 of FIG. 5 includes a driving circuit unit 140, a light-emitting device 104, and a module lens 110 integrally formed on a PCB 120. The PCB may be an MCPCB. At this point, a plurality of module lenses 110 can be provided, so that light-emitting devices 104 can correspond to the module lenses 110.

When light emitted from the plurality of light-emitting devices 104 is incident, the module lens 110 reflects the incident light to change a progression direction of the light. At this point, the module lens 110 is formed in a bar shape having a predetermined curvature.

The plurality of light-emitting devices 104 can include a red LED, a green LED, and a blue LED. Also, the plurality of light-emitting devices can additionally include LEDs in a variety of wavelength bands such as a yellow LED and an amber-colored LED. Here, the plurality of light-emitting devices 104 can be formed to emit light corresponding to a wavelength band of 380-760 nm.

Light emitted from the plurality of light-emitting devices 104 and having a variety of wavelength bands is reflected by the module lens 110. White light is formed by light reflected and mixed.

Meanwhile, the backlight unit can be used as a light source for providing white light to a liquid crystal display device. Generally, a predetermined distance should be secured in order to mix light in a variety of wavelength bands to form white light.

According to the present invention, light emitted from the plurality of light-emitting devices 104 is reflected and mixed by the module lens 110. Since a surface of the module lens 110 that faces the light-emitting device 104 is formed in a concave surface and supported by the support member 130 and thus spaced a sufficient distance from the light-emitting device 104, mixing of light can be easily performed.

The light-emitting module 300 having the above construction is formed inside the lower case 170. The heatsink plates 150 are formed on an outer surface of the lower case 170. Here, the light-emitting module 300 can be coupled to the lower case 170 using a screw. Accordingly, assembly the light-emitting module 300 and the lower case 170 can be easily realized.

Also, the control unit 160 is formed between the heatsink plates 150 provided on the outer surface of the lower case 170. Since the control unit 160 is positioned on a space between the heatsink plates 150 as described above, a slim type backlight unit can be provided.

The control unit 160 delivers a control signal to the driving circuit unit 140 for driving the plurality of light-emitting devices 104. At this point, the driving circuit unit 140 and the control unit 160 can transmit a control signal using a communication module, for example, an RSC485 communication module.

According to the light-emitting module and the backlight unit having the same, a slim profile and a simple coupling structure can be realized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A light-emitting module comprising:
   a printed circuit board;
   a plurality of light-emitting devices formed on the printed circuit board, wherein the plurality of light-emitting devices comprises a red LED, a green LED and a blue LED;
   at least one module lens supported by the printed circuit board and reflecting light emitted from the plurality of light-emitting devices; and
   a supporting member formed on the printed circuit board to support the module lens, wherein one end of the supporting member is fixed to the printed circuit board and the other end of the supporting member is fixed to the module lens,
   wherein the light emitted from the plurality of light-emitting devices is mixed to form white light.

2. The light-emitting module according to claim 1, wherein the module lens has a concave surface facing the light-emitting device.

3. The light-emitting module according to claim 1, wherein the printed circuit board comprises a driving circuit unit for driving the light-emitting devices.

4. The light-emitting module according to claim 1, further comprising a heatsink plate for discharging heat is formed on a lower side of the printed circuit board.

5. A light-emitting module comprising:
   a printed circuit board;
   a plurality of light-emitting devices formed on the printed circuit board, wherein the plurality of light-emitting devices comprises a red LED, a green LED and a blue LED; and
   two or more module lenses supported by the printed circuit board and constituting a pair formed to face each other to reflect light emitted from the plurality of light-emitting devices,
   wherein the light emitted from the plurality of light-emitting devices is mixed to form white light,
   wherein the modular lenses are separated a predetermined distance from the light-emitting devices, and formed in a curved surface from the printed circuit board to a portion above the light-emitting devices, and two module lenses of two or more modular lenses are disposed such that convex surfaces of the two module lenses face each other.

6. The light-emitting module according to claim 5, further comprising a driving circuit unit formed on the printed circuit board to drive the plurality of light-emitting devices.

7. The light-emitting module according to claim 5, further comprising a support member fixed to the printed circuit board to support the module lens.

8. The light-emitting module according to claim 5, further comprising a heatsink plate for discharging heat is formed on a lower side of the printed circuit board.

9. A backlight unit comprising:
   a light-emitting module comprising a printed circuit board, a plurality of light-emitting devices formed on the printed circuit board, and a module lens for reflecting light emitted from the plurality of light-emitting devices, wherein the printed circuit board comprises a driving circuit unit for driving the light-emitting devices;
   a lower case for supporting the light-emitting module, wherein the lower case comprises a bottom surface and a side surface, and the side surface is inclined to the bottom surface;
   at least two heatsink plates under the lower case; and
   a control unit for controlling the driving circuit unit formed between the heatsink plates.

10. The backlight unit according to claim 9, wherein the module lens is separated a predetermined distance from the light-emitting devices, and formed in a curved surface from the printed circuit board to a portion above the light-emitting devices.

11. The backlight unit according to claim 9, further comprising a support member fixed to the printed circuit board to support the module lens.

12. The backlight unit according to claim 9, wherein the module lens has a concave surface facing the light-emitting devices.

13. The backlight unit according to claim 9, wherein the module lens has one side supported by the printed circuit board and the other side supported by a support member formed on the printed circuit board.

14. The backlight unit according to claim 9, wherein the light-emitting module includes a plurality of module lenses, and at least two module lenses of the plurality of module lenses are disposed such that convex surfaces of the two module lenses face each other.

* * * * *